(12) United States Patent
Godil et al.

(10) Patent No.: US 6,169,624 B1
(45) Date of Patent: Jan. 2, 2001

(54) ACHROMATIC OPTICAL MODULATORS

(76) Inventors: Asif A. Godil, 2014 Colony St., Apt. 2, Mountain View, CA (US) 94043; David M. Bloom, 1855 Bret Hart, Palo Alto, CA (US) 94303

( * ) Notice: Under 35 U.S.C. 154(b), the term of this patent shall be extended for 0 days.

(21) Appl. No.: 09/372,649

(22) Filed: Aug. 11, 1999

(51) Int. Cl.[7] .............................. G02B 26/00; G02B 6/26; G02F 1/03; G02F 1/29; G02F 1/295

(52) U.S. Cl. ..................... 359/237; 359/254; 359/263; 359/318; 385/8; 385/27

(58) Field of Search ........................ 359/237, 254, 359/263, 318, 572, 573; 385/4, 8, 9, 18, 27

(56) References Cited

U.S. PATENT DOCUMENTS 5,991,079 * 11/1999 Furlani ............................ 359/573

* cited by examiner

Primary Examiner—Georgia Epps
Assistant Examiner—Michael A. Lucas
(74) Attorney, Agent, or Firm—Wilson Sonsini Goodrich & Rosati

(57) ABSTRACT

Micromachined grating modulators which exhibit achromatic behavior are described. One embodiment includes narrow and wide ribbons suspended above a substrate and alternatingly interleaved with each other. Narrow and wide reflective surfaces are formed on the narrow and wide ribbons. Compensating reflective surfaces are formed in the gaps between and beneath the ribbons. The width of the ribbons as well as the width of the gaps and the compensating reflecting surfaces are designed so that incident optical beam can be modulated or attenuated in an achromatic fashion.

31 Claims, 4 Drawing Sheets

ACHROMATIC OPTICAL MODULATORS

BACKGROUND OF THE INVENTION

1. Field of the Invention

The present invention relates to achromatic optical modulators. More particularly, the present invention relates to micromachined grating modulators which exhibit achromatic behavior.

2. Description of Related Art

Micromachined diffraction grating modulators are used in fiber optic components such as attenuators, filters, and modulators. These diffraction gratings typically include reflective surfaces and are used as reflective light processing elements. The diffraction gratings are optically coupled to input and output optical fibers and collimating/focusing lenses which direct an optical beam to the reflective surfaces. The reflective surfaces can be controlled to modify characteristics of the incident optical beam. Micromachined grating modulators are typically manufactured using CMOS silicon processing techniques.

The first micromachined diffraction grating modulators include ribbons of a uniform width formed over a substrate. The ribbons include a reflective surface which are coplanar and parallel to the surface of the substrate. The ribbons are separated by gaps of a similar width. Additional reflective surfaces are formed on the substrate between the ribbons in the gaps. A controllable voltage applied to some or all of the ribbons causes the ribbons to deflect toward the substrate and thus affect one or more characteristics of an incident optical beam. These gratings exhibit an especially strong spectral dependence when used as a modulator/attenuator on the 0th order reflected light, when the incident optical beam deviates from the center wavelength. The light attenuation of such a device is spectrally dependent, especially for large attenuation. As a result, these devices are unacceptable for fiber optic networks which operate over a large wavelength band, such as the erbium doped fiber amplifier (EDFA) band.

More recent orating modulators minimize the width of the gaps between the ribbons. Thus, these diffraction gratings include ribbons of uniform width spaced as closely together as possible over the substrate. No additional reflective surfaces are formed on the substrate. Again, a controllable voltage applied to some or all of the ribbons causes the ribbons to deflect toward the substrate and thus affect one or more characteristics of an incident optical beam. These gratings represent an improvement over the earliest gratings, but still exhibit a sufficiently strong spectral dependence to make them unacceptable for fiber optic networks which operate over a large wavelength band.

What is needed is an optical modulator/attenuator which exhibits achromatic behavior.

SUMMARY OF THE INVENTION

The present invention is directed towards a reflective light processing element capable of modifying at least one characteristic of an optical beam. The reflective light processing element comprises a plurality of wide reflective surfaces, the wide reflective surfaces being substantially coplanar; a plurality of narrow reflective surfaces, the narrow reflective surfaces being substantially coplanar, the narrow reflective surfaces facing substantially a same direction as the wide reflective surfaces, the narrow reflective surfaces alternatingly arranged with the wide reflective surfaces, the narrow reflective surfaces and the wide reflective surfaces defining a plurality of gaps between and normal to the narrow reflective surfaces and the wide reflective surfaces; and a plurality of compensating reflective surfaces, the compensating reflective surfaces being substantially coplanar, the compensating reflective surfaces facing substantially the same direction as the narrow reflective surfaces and the wide reflective surfaces, the compensating reflective surfaces being positioned in each gap beneath the narrow reflective surfaces and the wide reflective surfaces, each compensating reflecting surface being at least as wide as each gap. The wide reflective surfaces are capable of a displacement in a direction normal to the narrow reflective surfaces and compensating reflecting surfaces, the displacement capable of modifying at least one characteristic of the incident optical beam.

DETAILED DESCRIPTION OF THE INVENTION

Figure 1A:
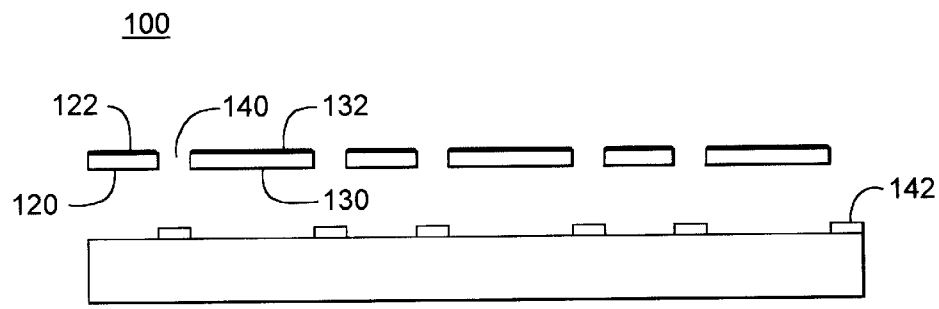
FIGS. 1A–1B show side and perspective views of one embodiment of the achromatic grating of the present invention.
Figure 1B:
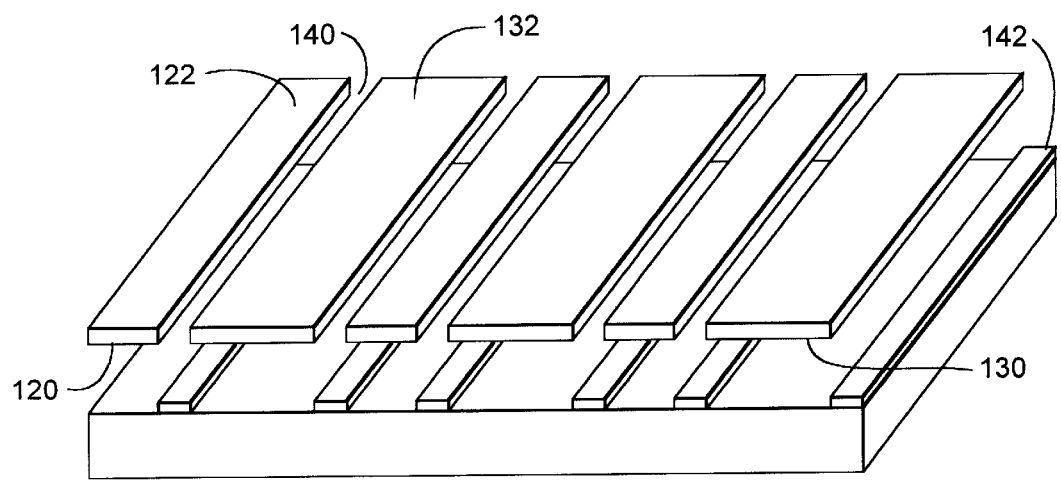

FIGS. 1A–1B show a side and perspective views of one embodiment of a achromatic grating 100 of the present invention. Achromatic grating 100 includes a substrate 110, a plurality of narrow ribbons 120 interleaved with a plurality of wide ribbons 130 and suspended above substrate 110, and a plurality of gaps 140 between narrow ribbons 120 and wide ribbons 130. A plurality of narrow reflective surfaces 122 are formed on narrow ribbons 120, a plurality of wide reflective surfaces 130 are formed on wide ribbons 130, and a plurality of compensating reflective surfaces 142 are formed beneath gaps 140. Narrow ribbons 120, wide ribbons, and gaps 140 may each be of uniform width, or they may be tapered. Compensating reflective surfaces 142 may be at least as wide as gaps 140.

Substrate 110 may be a silicon substrate. In some cases the silicon substrate may be covered with a thin layer of oxide, TiN, or some other suitable dielectric or metal. Ribbons 120 and 130 may be made of silicon nitride, poly-silicon, or some other suitable material. Narrow reflective surfaces 122, wide reflective surfaces 132 and compensating reflective surfaces 142 may be formed by depositing a metal coating such as gold or aluminum.

The application of a voltage between substrate 110 and ribbons 120 and 130 causes ribbons 120 and 130 to deflect towards substrate 110. This changes the reflective properties of achromatic grating 100. In this fashion, an incident light beam may be modulated or attenuated. An incident light beam may also be filtered.

In one embodiment, narrow and wide ribbons 120 and 130 are positioned such that narrow and wide reflective surfaces 122 and 132 are suspended Nλ/2 above compensating reflective surfaces 142, the ratio of the width of a wide ribbon 130 to the width of a gap 140 is ½N, and the total width of a narrow ribbon 120 and two gaps 140 is equal to the width of a wide ribbon 130. For example, narrow and wide reflective surfaces 122 and 132 are suspended 1.5λ above compensating reflective surfaces 142, wide ribbons 130 are 24 μm in width, narrow ribbons 120 are 20 μm in width, and gaps 140 are 2 μm in width.

Figure 2A:
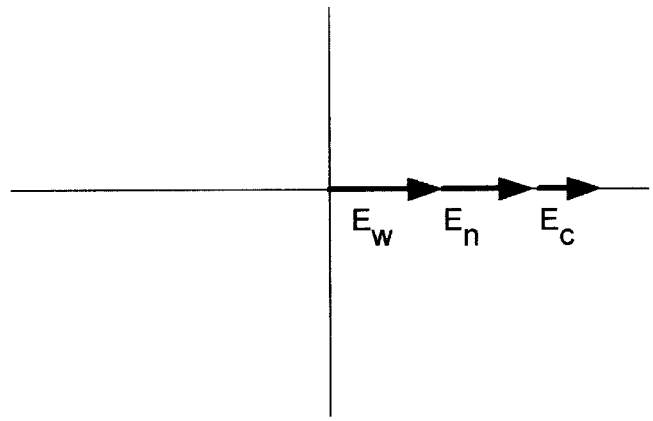
FIGS. 2A–2C show phasor diagrams demonstrating operation of the achromatic grating of the present invention.
Figure 2B:
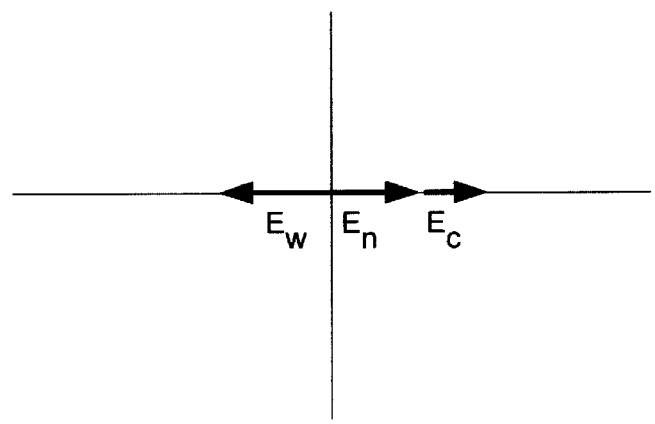
Figure 2C:
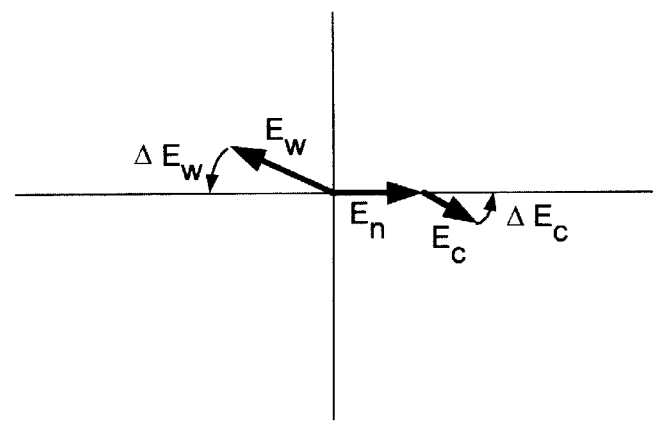

FIGS. 2A–2C show phasor diagrams demonstrating operation of the achromatic grating 100 of the present invention. Wide reflective surfaces 132 are represented by the phasor $E_w$. Narrow reflective surfaces 122 are represented by the phasor $E_n$. Compensating reflective surfaces 142 are represented by the phasor $E_c$. In this example, $E_w$ has a magnitude of 24, $E_n$ has a magnitude of 20, and $E_c$ has a magnitude of 4. In this example, achromatic grating 100 is functioning as an attenuator.

FIG. 2A shows achromatic grating 100 operating in the minimum attenuation mode. No voltage is applied to ribbons 120 and 130 and no deflection occurs. Achromatic grating 100 thus acts as a mirror. The phasor $E_w$ is in line with $E_n$, and $E_c$. In this example, narrow and wide reflective surfaces 122 and 132 are suspended 1.5λ above compensating reflective surfaces 142 and the light reflected off of compensating reflective surfaces 142 must travel an additional 3λ, thus the phasor $E_c$, has been displaced counterclockwise by 6π.

FIG. 2B shows achromatic grating 100 operating in the maximum attenuation mode. A voltage is applied to wide ribbons 130 to deflect wide reflective surfaces 132 toward compensating reflective surfaces 142 by λ/4. The light reflected off of wide reflective surfaces 132 must travel an additional distance of λ/2, or π, and destructively interferes with the light reflected off of narrow reflective surfaces 122 and through gaps 140 and off of compensating reflective surfaces 142. The phasor $E_w$ rotates counterclockwise by π, canceling out $E_n$ and $E_c$. Achromatic grating 100 may achieve different degrees of attenuation by deflecting wide reflective surfaces 132 a distance between zero and λ/4 toward compensating reflective surfaces 142.

FIG. 2C shows the compensating effect of compensating reflective surfaces 142 for large attenuation. Light which deviates from the center wavelength reflected off of wide reflective surfaces 132 creates a $\Delta E_w$ component. Achromatic grating 100 displays achromatic behavior because this component is canceled out by the light reflected off of compensating reflective surfaces 142. In other words, light which deviates from the center wavelength $\lambda_c$ by ±Δλ creates a $\Delta E_w$ component caused by the movement of $E_w$. This component is canceled out by the much greater movement of $E_c$. In this example, $E_w$ is six times the magnitude of $E_c$, however, $E_c$ moves six times as much as $E_w$, thus $\Delta E_c$ cancels out $\Delta E_w$, resulting in achromatic attenuation.

Thus, the height at which narrow and wide reflective surfaces 122 and 132 are suspended above compensating reflective surfaces 142, as well as the widths of the reflective surfaces, can be selected to produce achromatic grating 100 which exhibits achromatic behavior. This achromatic behavior is desirable for wideband operation in many fiber optic components including optical attenuators.

Figure 3:
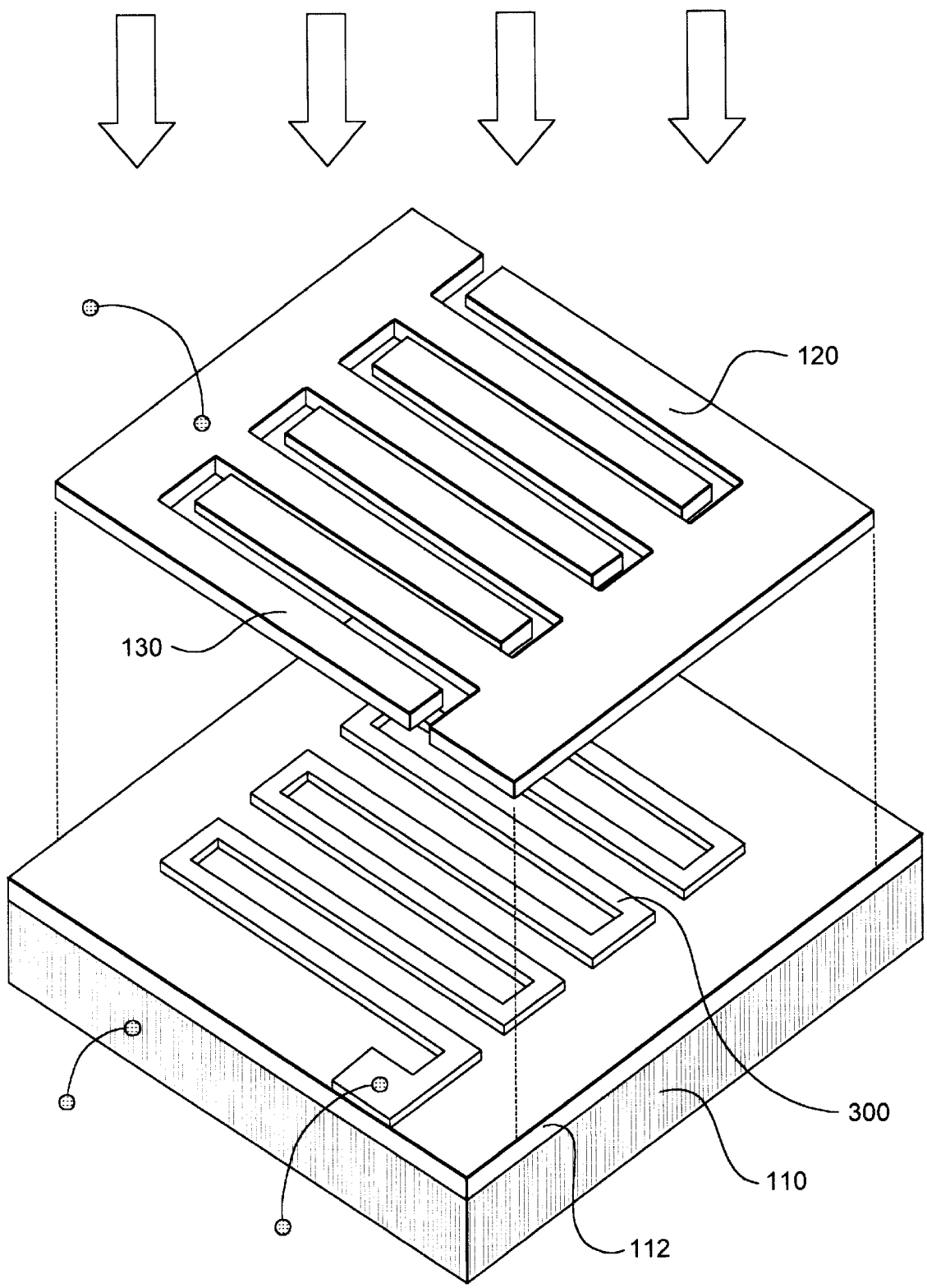
FIG. 3 shows another embodiment of an achromatic grating having a conductive trace.

FIG. 3 shows a perspective view of another embodiment of a achromatic grating 100 having a conductive trace 300 formed on a dielectric layer 112 of substrate 110. Conductive trace 300 may have a serpentine configuration, and may be formed of a metal such as gold or aluminum. Conductive trace 300 may be patterned by conventional lithography on dielectric layer 112 during the fabrication process. Alternatively, conductive trace 300 may be formed by using a self-masking approach by using narrow and wide ribbons 120 and 130 as a membrane with slits, followed by a metal evaporation process represented by the arrows that coats narrow and wide ribbons 120 and 130 as well as the exposed area of the underlying dielectric layer 112.

In certain cases, due to processing requirements, dielectric layer 112 is deposited on the surface of substrate 110 and remains after device fabrication is complete. The application of a voltage between substrate 110 and ribbons 120 and 130 during typical device operation causes electric charge to be injected into dielectric layer 112. Because dielectric layer 112 is non-conductive, the charge may be trapped within it, even after the applied voltage is turned off. The presence of electric charge in dielectric layer 112 may adversely affect device operating characteristics.

By providing a low-resistance escape path such as conductive trace 300 for the trapped charges, this can be avoided. Such a trace, when connected to an external terminal such as a ground, provides an escape path for trapped electric charges in dielectric layer 112. Because the effectiveness of such an escape path is expected to decrease with increasing distance from the trapped charge, conductive trace 300 is preferably routed in such a manner that all locations on dielectric layer 112 are close to conductive trace 300. One such routing scheme is a serpentine configuration.

Figure 4:
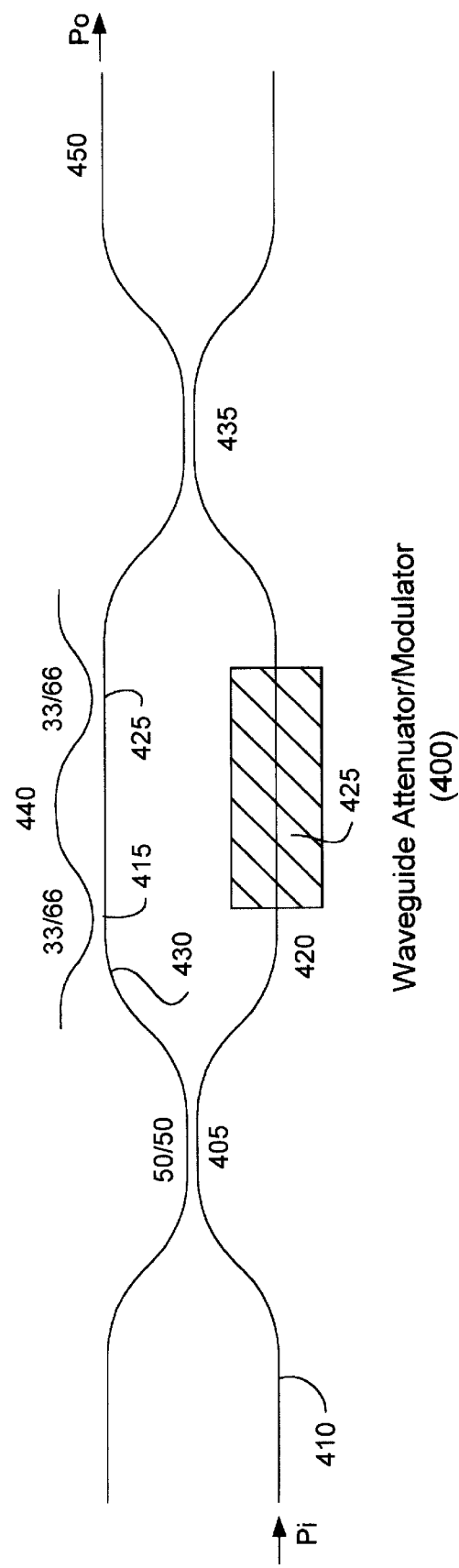
FIG. 4 shows a waveguide modulator of the present invention.

FIG. 4 shows another embodiment of an optical modulator/attenuator of the present invention in waveguide configuration. Waveguide attenuator 400 includes an input waveguide 410, a modulating waveguide 420 with a modulating device 425, a reference waveguide 430, a compensating waveguide 440, and an output waveguide 450. The waveguides may be made of $LiNbO_3$, silica glass, or polymer. Modulating device 425 may be electrooptic for $LiNbO_3$ or polymer waveguides, or thermooptic for polymer or silica glass waveguides.

Input waveguide 410 carries a light beam, which is split by a first directional coupler 405 equally into modulating and reference waveguides 420 and 430. Modulating device 425 changes the phase of the light propagating through modulating waveguide 420 either by applying a voltage on an electrode or by passing current through a heating element.

In this embodiment, a second directional coupler 415 couples one-third of the light from reference waveguide 430 to compensating waveguide 440. The path length of compensating waveguide 440 is 3λ/2 (3π) longer than the corresponding section of reference waveguide 430. The 90-degree phase shifts associated with coupled light implies that after a third directional coupler 425, in this embodiment an one-third coupler, the light coupled from compensating waveguide 440 is in phase with reference waveguide 430 and all of it is coupled back into reference waveguide 430. The path length of reference waveguide 430 is matched to modulating waveguide 420 without modulation. In this case the light from modulating and reference waveguides 420 and 430 is combined by a fourth directional coupler 435 and emerges at output waveguide 450. At the point of maximum attenuation, the phase of modulating waveguide 420 is changed by π. However, this phase is wavelength dependent and by itself will lead to spectrally dependent attenuation. Compensating waveguide 440 serves to add another wavelength dependent phasor which cancels this spectral dependence and gives achromatic attenuation.

In the above example, the compensating waveguide phasor is one-third the magnitude of the modulating waveguide phasor but rotates three times faster with wavelength, and thus the change in the two phasors with wavelength is equal and opposite. Generally, if the path length of compensating waveguide 440 is (2N+1)λ/2 longer than the corresponding section of reference waveguide 430, then 1/(2N+1) couplers should be selected for directional couplers 415 and 425. Other waveguide circuits incorporating this principle are possible. While the invention has been described in terms of some specific examples and in some specific embodiments, it will be clear that this invention is not limited to these specific examples and embodiments and that many changes and modified embodiments will be obvious to those skilled in the art without departing from the true spirit and scope of the invention as defined in the appended claims.

What is claimed is:

1. A reflective light processing element capable of modifying at least one characteristic of an optical beam, comprising:

a plurality of wide reflective surfaces, the wide reflective surfaces being substantially coplanar;

a plurality of narrow reflective surfaces, the narrow reflective surfaces being substantially coplanar, the narrow reflective surfaces facing substantially a same direction as the wide reflective surfaces, the narrow reflective surfaces alternatingly arranged with the wide reflective surfaces, the narrow reflective surfaces and the wide reflective surfaces defining a plurality of gaps between and normal to the narrow reflective surfaces and the wide reflective surfaces; and a plurality of compensating reflective surfaces, the compensating reflective surfaces being substantially coplanar, the compensating reflective surfaces facing substantially the same direction as the narrow reflective surfaces and the wide reflective surfaces, the compensating reflective surfaces being positioned in each gap beneath the narrow reflective surfaces and the wide reflective surfaces, each compensating reflecting surface being at least as wide as each gap;

wherein the wide reflective surfaces are capable of a displacement in a direction normal to the narrow reflective surfaces and compensating reflecting surfaces, the displacement of the wide reflective surfaces capable of modifying at least one characteristic of the incident optical beam.

2. The reflective light processing element of claim 1, wherein the compensating reflective surfaces are positioned $N\lambda/2$ beneath the narrow reflective surfaces, N being an integer and $\lambda$ being a center wavelength of an incident optical beam.

3. The reflective light processing element of claim 2, wherein the gaps are ½N times a width of a wide reflective surface.

4. The reflective light processing element of claim 3, wherein the narrow reflective surfaces have a width equal to a width of a wide reflective surface minus a width of two gaps.

5. The reflective light processing element of claim 1, wherein the wide reflective surfaces and the narrow reflective surfaces are formed on micromachined ribbons.

6. The reflective light processing element of claim 1, wherein the substrate is a silicon substrate.

7. The reflective light processing element of claim 1, wherein the wide reflective surfaces are of a substantially uniform width.

8. The reflective light processing element of claim 1, wherein the narrow reflective surfaces are of a substantially uniform width.

9. The reflective light processing element of claim 1, wherein the gaps are of a substantially uniform width.

10. The reflective light processing element of claim 1, wherein the wide reflective surfaces and the narrow reflective surfaces are substantially coplanar.

11. The reflective light processing element of claim 1, wherein the narrow reflective surfaces are capable of a displacement in a direction normal to the wide reflective surfaces and compensating reflecting surfaces, the displacement of the narrow reflective surfaces capable of modifying at least one characteristic of the incident optical beam.

12. A reflective light processing element capable of modifying at least one characteristic of an incident optical beam, comprising:

a substrate;

a plurality of wide ribbons suspended above the substrate, the wide ribbons having wide reflective surfaces, the wide reflective surfaces being substantially coplanar;

a plurality of narrow ribbons suspended above the substrate, the narrow ribbons having narrow reflective surfaces, the narrow reflective surfaces being substantially coplanar, the narrow reflective surfaces facing substantially a same direction as the wide reflective surfaces, the narrow ribbons alternatingly arranged with the wide ribbons, the narrow ribbons and the wide ribbons defining a plurality of gaps between and normal to the narrow reflective surfaces and the wide reflective surfaces;

a plurality of compensating reflective surfaces formed on the substrate, the compensating reflective surfaces being substantially coplanar, the compensating reflective surfaces facing substantially the same direction as the narrow reflective surfaces and the wide reflective surfaces, the compensating reflective surfaces being positioned in each gap beneath the narrow ribbons and the wide ribbons, each compensating reflecting surface being at least as wide as each gap;

wherein the wide ribbons are capable of a displacement upon application of a voltage between the substrate and the wide ribbons, the displacement of the wide ribbons being in a direction normal to the narrow reflective surfaces and compensating reflecting surfaces, the displacement of the wide ribbons capable of modifying at least one characteristic of the incident optical beam.

13. The reflective light processing element of claim 12, wherein the compensating reflective surfaces are positioned $N\lambda/2$ beneath the narrow reflective surfaces, N being an integer and $\lambda$ being a center wavelength of an incident optical beam.

14. The reflective light processing element of claim 13, wherein the gaps are ½ N times a width of a wide reflective surface.

15. The reflective light processing element of claim 14, wherein the narrow reflective surfaces have a width equal to a width of a wide reflective surface minus a width of two gaps.

16. The reflective light processing element of claim 12, wherein the wide reflective surfaces and the narrow reflective surfaces are formed on micromachined ribbons.

17. The reflective light processing element of claim 12, wherein the substrate is a silicon substrate.

18. The reflective light processing element of claim 12, wherein the wide reflective surfaces are of a substantially uniform width.

19. The reflective light processing element of claim 12, wherein the narrow reflective surfaces are of a substantially uniform width.

20. The reflective light processing element of claim 12, wherein the gaps are of a substantially uniform width.

21. The reflective light processing element of claim 12, wherein the wide reflective surfaces and the narrow reflective surfaces are substantially coplanar.

22. The reflective light processing element of claim 12, wherein the narrow ribbons are capable of a displacement upon application of a voltage between the substrate and the narrow ribbons, the displacement of the narrow ribbons being in a direction normal to the wide reflective surfaces and compensating reflecting surfaces, the displacement of the narrow ribbons capable of modifying at least one characteristic of the incident optical beam.

23. A reflective light processing element, comprising:
   a substrate;
   a dielectric layer formed on the substrate;
   a conductive trace formed on the dielectric layer, the conductive trace allowing charges trapped in the dielectric layer to escape; and
   a plurality of ribbons formed above the substrate and the conductive trace.

24. A waveguide attenuator, comprising:
   an input waveguide;
   a modulating waveguide continuous with the input waveguide;
   a modulating device coupled to the modulating waveguide, the modulating device capable of changing phase of light traveling through the modulating waveguide;
   a reference waveguide optically coupled to the input waveguide by a first directional coupler;
   a compensating waveguide optically coupled to the reference waveguide by a second and third directional couplers; and
   an output waveguide continuous with the reference waveguide, the output waveguide optically coupled to the modulating waveguide by a fourth directional coupler.

25. The waveguide attenuator of claim 24, wherein the first and fourth directional couplers are 50—50 directional couplers.

26. The waveguide attenuator of claim 24, wherein light traveling through the compensating waveguide travels $(2N+1)\lambda/2$ farther than light traveling through a corresponding section of the reference waveguide.

27. The waveguide attenuator of claim 26, wherein the second and third directional couplers are $1/(2N+1)$ couplers.

28. A method for achromatic modulation of an optical beam, comprising:
   carrying an optical beam through an input waveguide;
   splitting the optical beam into a first and second portions with a first directional coupler, the first portion being carried in a reference waveguide, the second portion being carried in a modulating waveguide, the reference waveguide being optically coupled to the input waveguide by the first directional coupler, the modulating waveguide being continuous with the input waveguide;
   modulating the second portion by changing the phase of the second portion in the modulating waveguide;
   compensating for achromatic effects introduced in the modulating waveguide by splitting the first portion into third and fourth portions with a second directional coupler, the third portion being carried in a compensating waveguide, the fourth portion being carried in the reference waveguide, and then recombining the third and fourth portions into the reference waveguide with a third directional coupler;
   recombining the second portion with the third and fourth portions into an output waveguide with a fourth directional coupler, the output waveguide being continuous with the reference waveguide, the recombined optical beam being modulated.

29. The waveguide attenuator of claim 28, wherein the first and fourth directional couplers are 50—50 directional couplers.

30. The waveguide attenuator of claim 28, wherein light traveling through the compensating waveguide travels $(2N+1)\lambda/2$ farther than light traveling through a corresponding section of the reference waveguide.

31. The waveguide attenuator of claim 30, wherein the second and third directional couplers are $1/(2N+1)$ couplers.

* * * * *